US011568952B2

(12) United States Patent
Tran et al.

(10) Patent No.: US 11,568,952 B2
(45) Date of Patent: Jan. 31, 2023

(54) ADJUSTABLE PROGRAMMING PULSES FOR A MULTI-LEVEL CELL

(71) Applicant: Micron Technology, Inc., Boise, ID (US)

(72) Inventors: Xuan-Anh Tran, Boise, ID (US); Nevil N. Gajera, Meridian, ID (US); Karthik Sarpatwari, Boise, ID (US); Amitava Majumdar, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/337,195

(22) Filed: Jun. 2, 2021

(65) Prior Publication Data

US 2022/0392560 A1    Dec. 8, 2022

(51) Int. Cl.
*G11C 29/44* (2006.01)
*G11C 29/46* (2006.01)
*G11C 29/12* (2006.01)
*G11C 16/10* (2006.01)
*G11C 16/26* (2006.01)
*G11C 16/34* (2006.01)
*G11C 29/00* (2006.01)

(52) U.S. Cl.
CPC ............ *G11C 29/44* (2013.01); *G11C 16/102* (2013.01); *G11C 16/26* (2013.01); *G11C 16/3495* (2013.01); *G11C 29/12005* (2013.01); *G11C 29/12015* (2013.01); *G11C 29/46* (2013.01); *G11C 29/787* (2013.01); *G11C 2029/1202* (2013.01); *G11C 2029/1204* (2013.01)

(58) Field of Classification Search
CPC ....... G11C 29/44; G11C 16/102; G11C 16/26; G11C 16/3495; G11C 29/12005; G11C 29/12015; G11C 29/46; G11C 29/787; G11C 2029/1202; G11C 2029/1204
See application file for complete search history.

(56) References Cited

U.S. PATENT DOCUMENTS

| | | | | |
|---|---|---|---|---|
| 7,593,255 B2 * | 9/2009 | Happ | .................. | G11C 11/5678 365/163 |
| 8,861,265 B2 * | 10/2014 | Kurosawa | .......... | G11C 13/0097 365/163 |
| 8,934,292 B2 * | 1/2015 | Costa | .................. | G11C 13/0007 365/163 |
| 10,366,752 B2 * | 7/2019 | Ramadan | ........... | G11C 13/0061 |

\* cited by examiner

*Primary Examiner* — Vanthu T Nguyen
(74) *Attorney, Agent, or Firm* — Holland & Hart LLP

(57) ABSTRACT

Methods, systems, and devices for adjustable programming pulses for a multi-level cell are described. A memory device may modify a characteristic of a programming pulse for an intermediate logic state based on a metric of reliability of associated memory cells. The modified characteristic may increase a read window and reverse a movement of a shifted threshold voltage distribution (e.g., by moving the threshold voltage distribution farther from one or more other voltage distributions). The metric of reliability may be determined by performing test writes may be a quantity of cycles of use for the memory cells, a bit error rate, and/or a quantity of reads of the first state. The information associated with the modified second pulse may be stored in fuses or memory cells, or may be implemented by a memory device controller or circuitry of the memory device.

25 Claims, 7 Drawing Sheets

ADJUSTABLE PROGRAMMING PULSES FOR A MULTI-LEVEL CELL

FIELD OF TECHNOLOGY

The following relates generally to one or more systems for memory and more specifically to adjustable programming pulses for a multi-level cell.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile.

DETAILED DESCRIPTION

A memory cell (e.g., a multi-level cell (MLC)) of a memory device may be used to store one of three or more states (e.g., logic states). For example, an MLC may be operable to store one of three possible states, which may be referred to as storing 1.5 bits per cell. The three or more states of an MLC may include a first state (e.g., a SET state), a second state (e.g., a RESET state), and a quantity of one or more intermediate states. A write operation for the intermediate state(s) of the MLC may include applying a first pulse of a first polarity to program the cell into one of the first or second states, and applying a second pulse of a second, opposite polarity to achieve one of the intermediate states. With 1.5 bits stored per cell (or higher), read windows between respective voltage threshold distributions of the possible states may be reduced, such that cycling the memory cells may cause one or more of the read windows to collapse (e.g., may shift one voltage threshold distribution associated with a first state towards another voltage threshold distribution associated with a second state), which may result in read errors.

The present disclosure provides techniques to modify a characteristic of the second pulse (e.g., a magnitude, a width, or a time between the first and second pulses) based on a metric of reliability of the memory cells. The modified characteristic may increase a collapsed read window, for example, by reversing a movement of a shifted threshold voltage distribution (e.g., by moving the threshold voltage distribution farther from one or more other voltage distributions). In some cases, the metric of reliability may be determined by performing test writes on un-used cells and identifying a condition of the cells. Additionally or alternatively, the metric of reliability may be a quantity of cycles of use for the memory cells, a bit error rate, and/or a quantity of reads of the first state (e.g., where coding is used to maintain a consistent quantity of cells of the first state in a given set of cells). The information associated with the modified second pulse may be stored in fuses or memory cells, or may be implemented by a memory device controller or circuitry of the memory device.

Features of the disclosure are initially described in the context of memory systems, dies, and arrays as described with reference to FIGS. 1-3. Features of the disclosure are described in the context of programming pulses and voltage graphs as described with reference to FIGS. 4A-4C and FIGS. 5A and 5B. These and other features of the disclosure are further illustrated by and described with reference to an apparatus diagram and flowcharts that relate to adjustable programming pulses for a multi-level cell as described with references to FIGS. 6 and 7.

Figure 1:
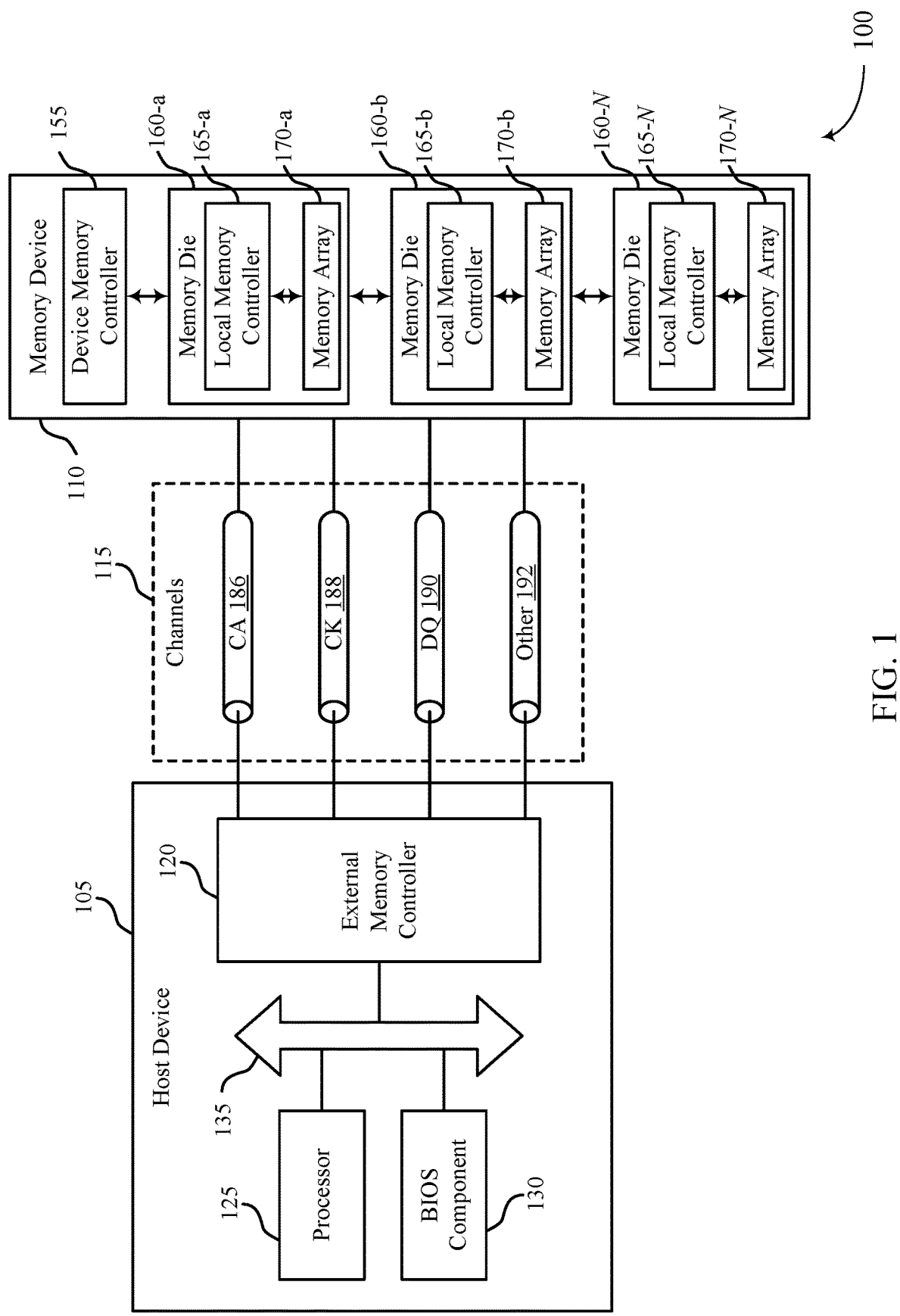
FIG. 1 illustrates an example of a system that supports adjustable programming pulses for a multi-level cell (MLC) in accordance with examples as disclosed herein.

FIG. 1 illustrates an example of a system 100 that supports adjustable programming pulses for an MLC in accordance with examples as disclosed herein. The system 100 may include a host device 105, a memory device 110, and a plurality of channels 115 coupling the host device 105 with the memory device 110. The system 100 may include one or more memory devices, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices 105. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110.

The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory device may modify a characteristic of a programming pulse for an intermediate logic state of a memory cell based on a metric of reliability of associated memory cells. The modified characteristic may increase a read window and reverse a movement of a shifted threshold voltage distribution (e.g., by moving the threshold voltage distribution farther from one or more other voltage distributions). The metric of reliability may be determined by performing test writes may be a quantity of cycles of use for the memory cells, a bit error rate, and/or a quantity of reads of the first state. The information associated with the modified second pulse may be stored in fuses or memory cells, or may be implemented by a memory device controller or circuitry of the memory device.

Figure 2:
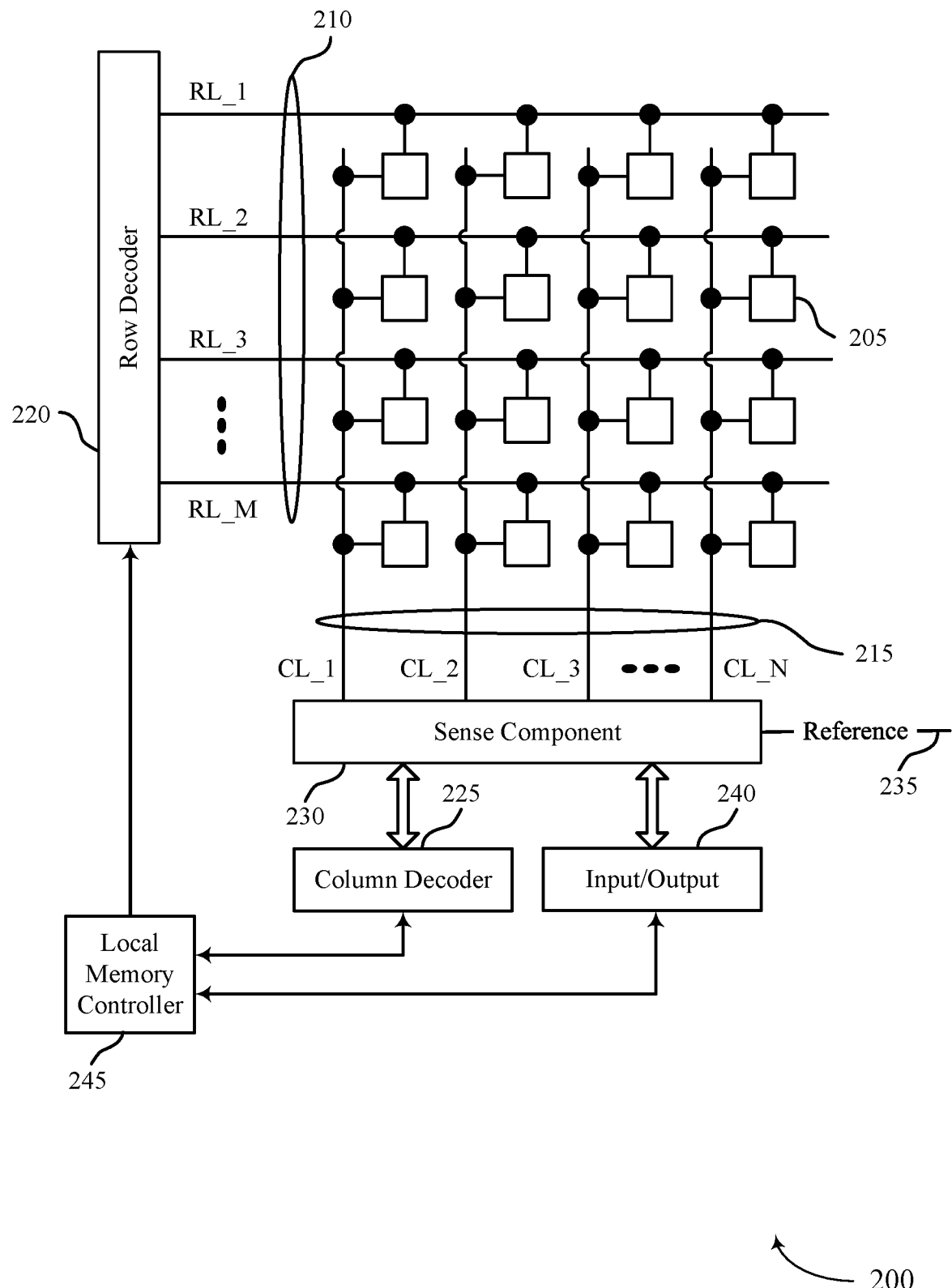
FIG. 2 illustrates an example of a memory die that supports adjustable programming pulses for an MLC in accordance with examples as disclosed herein.

FIG. 2 illustrates an example of a memory die 200 that supports adjustable programming pulses for an MLC in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., a programmed one of a set of two or more possible states). For example, a memory cell 205 may be operable to store one bit of information at a time (e.g., a logic 0 or a logic 1). In some examples, a memory cell 205 (e.g., a multi-level memory cell 205) may be operable to store more than one bit of information at a time (e.g., a logic 00, logic 01, logic 10, a logic 11). For example, a memory cell 205 may be operable to store 1.5 bits of information at a time (e.g., based on the memory cell 205 being able to store one of three logic states). In some examples, the memory cells 205 may be arranged in an array, such as a memory array 170 described with reference to FIG. 1.

A memory cell 205 may store a logic state using a configurable material, which may be referred to as a memory element, a memory storage element, a material element, a material memory element, a material portion, or a polarity-written material portion, among others. A configurable material of a memory cell 205 may refer to a chalcogenide-based storage component, as described in more detail with reference to FIG. 3. For example, a chalcogenide storage element may be used in a phase change memory (PCM) cell, a thresholding memory cell, or a self-selecting memory cell.

The memory die 200 may include access lines (e.g., row lines 210 and the column lines 215) arranged in a pattern, such as a grid-like pattern. Access lines may be formed of one or more conductive materials. In some examples, row lines 210 may be referred to as word lines. In some examples, column lines 215 may be referred to as digit lines or bit lines. References to access lines, row lines, column lines, word lines, digit lines, or bit lines, or their analogues, are interchangeable without loss of understanding or operation. Memory cells 205 may be positioned at intersections of the row lines 210 and the column lines 215.

Operations such as reading and writing may be performed on the memory cells 205 by activating or selecting access lines such as one or more of a row line 210 or a column line 215. By biasing a row line 210 and a column line 215 (e.g., applying a respective voltage to the row line 210 or the column line 215, or both), a single memory cell 205 may be accessed at their intersection. The intersection of a row line 210 and a column line 215 in either a two-dimensional or three-dimensional configuration may be referred to as an address of a memory cell 205. An access line may be a conductive line coupled with a memory cell 205 and may be used to perform access operations on the memory cell 205.

Accessing the memory cells 205 may be controlled through a row decoder 220 or a column decoder 225. For example, a row decoder 220 may receive a row address from the local memory controller 245 and activate a row line 210 based on the received row address. A column decoder 225 may receive a column address from the local memory controller 245 and may activate a column line 215 based on the received column address.

The sense component 230 may be operable to detect a state (e.g., a material state, a resistance, a threshold state) of a memory cell 205 and determine a logic state of the memory cell 205 based on the stored state. The sense component 230 may include one or more sense amplifiers to amplify or otherwise convert a signal resulting from accessing the memory cell 205. The sense component 230 may compare a signal detected from the memory cell 205 to a reference 235 (e.g., a reference voltage). The detected logic state of the memory cell 205 may be provided as an output of the sense component 230 (e.g., to an input/output 240), and may indicate the detected logic state to another component of a memory device that includes the memory die 200.

The local memory controller 245 may control the accessing of memory cells 205 through the various components (e.g., row decoder 220, column decoder 225, sense component 230). The local memory controller 245 may be an example of the local memory controller 165 described with reference to FIG. 1. In some examples, one or more of the row decoder 220, column decoder 225, and sense component 230 may be co-located with the local memory controller 245. The local memory controller 245 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 245 may generate row signals and column address signals to activate the target row line 210 and the target column line 215. The local memory controller 245 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 245 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 245 in response to various access commands (e.g., from a host device 105). The local memory controller 245 may be operable to perform other access operations not listed here or other operations related to the operating of the memory die 200 that are not directly related to accessing the memory cells 205.

The local memory controller 245 may be operable to perform a write operation (e.g., a programming operation) on one or more memory cells 205 of the memory die 200. During a write operation, a memory cell 205 of the memory die 200 may be programmed to store a desired logic state (e.g., one of three or more logic states). The local memory controller 245 may identify a target memory cell 205 on which to perform the write operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The local memory controller 245 may apply a specific signal (e.g., write pulse) to the column line 215 during the write operation to store a specific state in the storage element of the memory cell 205. The pulse used as part of the write operation may include one or more voltage levels over a duration.

The local memory controller 245 may be operable to perform a read operation (e.g., a sense operation) on one or more memory cells 205 of the memory die 200. During a read operation, the logic state stored in a memory cell 205 of the memory die 200 may be determined. The local memory controller 245 may identify a target memory cell 205 on which to perform the read operation. The local memory controller 245 may identify a target row line 210 and a target column line 215 coupled with the target memory cell 205 (e.g., the address of the target memory cell 205). The local memory controller 245 may activate the target row line 210 and the target column line 215 (e.g., applying a voltage to the row line 210 or column line 215) to access the target memory cell 205. The sense component 230 may detect a signal received from the memory cell 205 that is based on the pulse applied to the row line 210, the pulse applied to the column line, and/or a resistance or threshold characteristic of the memory cell 205. The sense component 230 may amplify the signal. The local memory controller 245 may activate the sense component 230 (e.g., latch the sense component) and thereby compare the signal received from the memory cell 205 to the reference signal 235. Based on that comparison, the sense component 230 may determine a logic state that is stored on the memory cell 205. The pulse used as part of the read operation may include one or more voltage levels over a duration.

Figure 3:
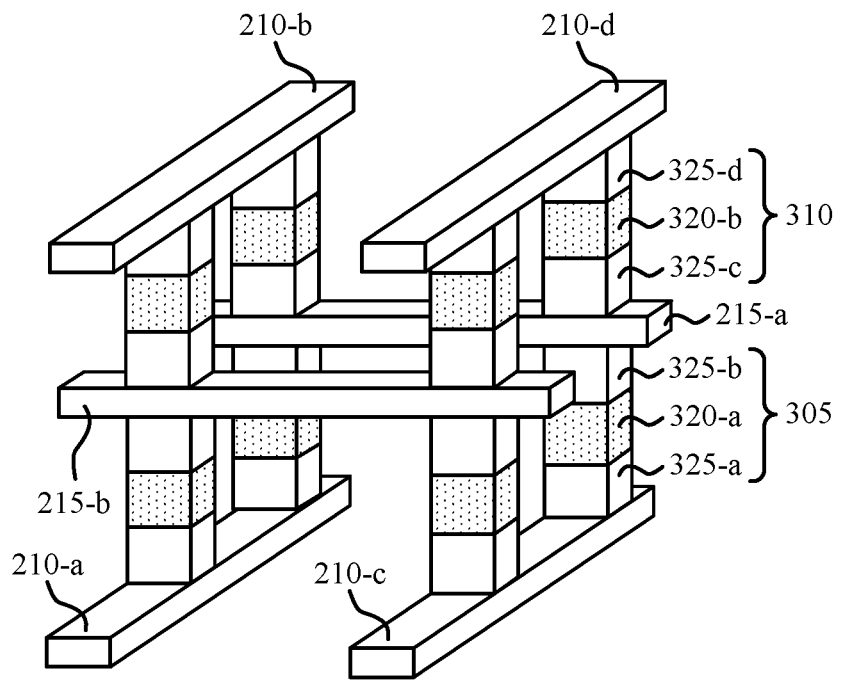
FIG. 3 illustrates an example of memory cells that support adjustable programming pulses for an MLC in accordance with examples as disclosed herein.

FIG. 3 illustrates an example of a memory array 300 in accordance with examples as disclosed herein. Memory array 300 may be an example of portions of the memory arrays or memory dies described with reference to FIGS. 1 and 2. The memory array 300 may include a first deck 305 of memory cells that is positioned above a substrate (not shown) and a second deck 310 of memory cells on top of the first array or deck 305. Though the example of memory array 300 includes two decks 305, 310, the memory array 300 may include any quantity of decks (e.g., one or more than two).

Memory array 300 may also include a row line 210-a, a row line 210-b, a row line 210-c, a row line 210-d, a column line 215-a, and a column line 215-b, which may be examples of row lines 210 and column lines 215, as described with reference to FIG. 2. One or more memory cells of the first deck 305 and the second deck 310 may include one or more chalcogenide materials in a pillar between access lines. For example, a single stack between access lines may include one or more of a first electrode, a first chalcogenide material (e.g., selector component), a second electrode, a second chalcogenide material (e.g., storage element), or a third electrode. Although some elements included in FIG. 3 are labeled with a numeric indicator, other corresponding elements are not labeled, although they are the same or would be understood to be similar, in an effort to increase visibility and clarity of the depicted features.

One or more memory cells of the first deck 305 may include one or more of an electrode 325-a, a storage element 320-a, or an electrode 325-b. One or more memory cells of the second deck 310 may include an electrode 325-c, a storage element 320-b, and an electrode 325-d. The storage elements 320 may be examples of a chalcogenide material, such as a phase change storage element, a thresholding storage element, or a self-selecting storage element. The memory cells of the first deck 305 and second deck 310 may, in some examples, have common conductive lines such that corresponding memory cells of one or more decks 305 and one or more decks 310 may share column lines 215 or row lines 210. For example, the first electrode 325-c of the second deck 310 and the second electrode 325-b of the first deck 305 may be coupled with column line 215-a such that the column line 215-a may be shared by vertically adjacent memory cells.

The architecture of memory array 300 may be referred to as a cross-point architecture, in some examples, in which a memory cell is formed at a topological cross-point between a row line 210 and a column line 215. Such a cross-point architecture may offer relatively high-density data storage with lower production costs compared to other memory architectures. For example, the cross-point architecture may have memory cells with a reduced area and, resultantly, an increased memory cell density compared to other architectures. For example, the architecture may have a 4F2 memory cell area, where F is the smallest feature size, compared to other architectures with a 6F2 memory cell area, such as those with a three-terminal selector element. For example, DRAM may use a transistor, which is a three-terminal device, as the selector element for each memory cell and may have a larger memory cell area compared to the cross-point architecture.

While the example of FIG. 3 shows two memory decks, other configurations are possible. In some examples, a single memory deck of memory cells may be constructed above a substrate, which may be referred to as a two-dimensional memory. In some examples, two or more decks of memory cells may be configured in a similar manner in a three-dimensional cross point architecture. Further, in some cases, elements shown in or described with reference to FIG. 3 may be electrically coupled with one another as shown or described but rearranged physically (e.g., a storage element 320 and possibly a selection element or electrode 325 may be electrically in series between a row line 210 and a column line 215 but need not be in a pillar or stack configuration).

In some examples, the material of the storage element 320 may include a chalcogenide material or other alloy including selenium (Se), tellurium (Te), arsenic (As), antimony (Sb), carbon (C), germanium (Ge), silicon (Si), or indium (IN), or various combinations thereof. In some examples, a chalcogenide material having primarily selenium (Se), arsenic (As), and germanium (Ge) may be referred to as a SAG-alloy. In some examples, a SAG-alloy may also include silicon (Si) and such chalcogenide material may be referred to as SiSAG-alloy. In some examples, SAG-alloy may include silicon (Si) or indium (In) or a combination thereof and such chalcogenide materials may be referred to as SiSAG-alloy or InSAG-alloy, respectively, or a combination thereof. In some examples, the chalcogenide glass may include additional elements such as hydrogen (H), oxygen (O), nitrogen (N), chlorine (CO, or fluorine (F), each in atomic or molecular forms.

In some examples, the storage element 320 may be an example of a phase change memory cell. In such examples, the material used in the storage element 320 may be based on an alloy (such as the alloys listed above) and may be operated so as to undergo a phase change or change to different physical state during normal operation of the memory cell. For example, a phase change memory cell may have an amorphous state (e.g., a relatively disordered atomic configuration) and a crystalline state (e.g., a relatively ordered atomic configuration).

Phase change memory cells may exhibit an observable difference between resistances of a crystalline state and an amorphous state in phase change materials, which may be chalcogenide materials. A material in the crystalline state may have atoms arranged in a periodic structure, which may result in a relatively low electrical resistance. By contrast, a material in an amorphous state may have no or relatively little periodic atomic structure, which may have a relatively high electrical resistance.

The difference in resistance values between amorphous and crystalline states of a material may be substantial. For example, a material in an amorphous state may have a resistance one or more orders of magnitude greater than the resistance of the material in its crystalline state. In some examples, the material may be partially amorphous and partially crystalline (e.g., in an intermediate state), and the resistance may be of some value between the resistances of the material in a wholly crystalline or wholly amorphous state. In such examples, a material may be used to store more than two logic states (e.g., three or more logic states).

During a programming (write) operation of a phase change memory cell (e.g., electrode 325-a, storage element 320-a, electrode 325-b), the various parameters of the programming pulse may influence (e.g., determine, set, program) a particular behavior or characteristic of the material of the storage element 320, such as the threshold voltage of the material or the resistance of the material. To program a low-resistance state (e.g., a relatively crystalline state) in the phase change memory cell, a programming pulse may be applied that heats or melts the material of the storage element 320, which may be associated with forming, at least temporarily, a relatively disordered (e.g., amorphous) atomic arrangement. The amplitude of the programming pulse may be reduced (e.g., relatively slowly) over a duration to allow the material to form crystalline structures as it cools, thereby forming a stable crystalline material state.

To program a high-resistance state (e.g., a relatively amorphous state) in the phase change memory cell, a programming pulse may be applied that heats and/or melts the material of the storage element 320. The amplitude of the programming pulse may be reduced more quickly than the programming pulse for the low-resistance state. In such scenarios, the material may cool with atoms in a more disordered atomic arrangement because the atoms were not able to form crystalline structures before the material reached a stable state, thereby forming a stable amorphous material state. The difference in threshold voltages or resistances of the material of the storage element 320 depending on the logic state stored by the material of the storage element 320 may correspond to the read window of the storage element 320. In some cases, a portion of a storage element may undergo a material change associated with the logic states.

In some examples, such as for thresholding memory cells or self-selecting memory cells, some or all of the set of logic states supported by the memory cells may be associated with an amorphous state of the chalcogenide material (e.g., the material in a single state may be operable to store different logic states). In some examples, the storage element 320 may be an example of a self-selecting memory cell. In such examples, the material used in the storage element 320 may be based on an alloy (such as the alloys listed above) and may be operated so as to undergo a change to different physical states during normal operation of the memory cell. For example, a self-selecting memory cell may have a high threshold voltage state and a low threshold voltage state. In some cases, the self-selecting memory cell may additionally have an intermediate threshold voltage state (e.g., between and in addition to the high threshold voltage state and the low threshold voltage state). A high threshold voltage state may correspond to a first logic state (e.g., a RESET state) and a low threshold voltage state may correspond to a second logic state (e.g., a SET state). An intermediate threshold voltage state may correspond to a third logic state (e.g., a SET-RESET state, or intermediate state).

During a programming (write) operation of a self-selecting memory cell (e.g., including electrode 325-a, storage element 320-a, and electrode 325-b), a polarity used for a write operation may influence (determine, set, program) a particular behavior or characteristic of the material of the storage element 320, such as the threshold voltage of the material. For example, a first write operation may write a first logic state (e.g., a SET state) to the self-selecting memory cell by applying a first pulse of a first polarity to the memory cell. Similarly, a second (e.g., different) write operation may write a second logic state (e.g., a RESET state) to the self-selecting memory cell by applying a second pulse of a second polarity to the memory cell. A third write operation may write a third logic state (e.g., an intermediate state) to the self-selecting memory cell by applying the first pulse, followed by the second pulse (e.g., after a time period). In some cases, if the self-selecting memory cell is operable to store more than three states, other write operation(s) may be used write one of the other states to the memory cell by applying one or more pulses, each pulse having a respective polarity.

A memory cell that is operable to store three or more states as described herein may be referred to as an MLC. An MLC that is operable to store three states (e.g., store one logic state out of a set of three logic states at a time) may represent a memory cell that stores 1.5 bits, for example, based on being able to store one of three logic states.

The difference in threshold voltages of the material of the storage element 320 depending on the logic state stored by the material of the storage element 320 (e.g., the difference between the threshold voltage when the material is storing a logic state '0' versus a logic state '1') may correspond to the read window of the storage element 320. In some cases (e.g., for MLCs), a memory cell may be associated with three or more threshold voltages (e.g., for reading the logic state stored by the cell), where each threshold voltage may be associated with a corresponding read window for determining the associated logic state.

In some cases, a memory array 300 of a memory device may include MLCs, where the threshold voltages for the MLCs of the memory array 300 may be grouped into different distributions. For example, a first subset of memory cells may each be programmed with a first state (e.g., a SET state) that is associated with a first threshold voltage distribution across the first subset of memory cells. Similarly, a second subset of memory cells may be programmed with a second state (e.g., a RESET state) that is associated with a second threshold voltage distribution, and a third subset of memory cells may be programmed with a third state (e.g., an intermediate state) that is associated with a third threshold voltage distribution. Each distribution may include respective threshold voltage values that are relatively close to each other (e.g., and representative of a same logic state associated with the distribution).

Based on one or more conditions for the MLCs of the memory array 300, some of the threshold voltage distributions may begin to drift, or change. For example, a subset of memory cells may begin to experience a change (e.g., an increase or decrease) in its threshold voltage distribution (e.g., each memory cell of the subset may experience a respective change in the threshold voltage of the memory cell). In such cases, the threshold voltage distribution (e.g., as a whole, based on individual changes to memory cells) associated with the subset of memory cells may drift closer to another threshold voltage distribution of another subset of memory cells. In such cases, a read window for (e.g., between) the logic states associated with the two subsets of memory cells may begin to collapse or shrink. In some cases, the collapsed window may result in an increased quantity of errors for reading the logic states of one or both of the subsets of memory cells (e.g., based on a smaller window or margin between the respective threshold voltage distributions).

For example, the third threshold voltage distribution (e.g., associated with the third, intermediate state) may begin to drift closer to the first threshold voltage distribution (e.g., associated with the first, SET state) as a quantity of usage cycles of the MLCs increases. As an amount of usage (e.g., a quantity of cycles) of the memory device increases, the read window for (e.g., between) the first and third logic states may begin to collapse or shrink, which may result in an increase in a quantity of read errors for the first and/or third logic states. Threshold voltage distributions, and associated drifts in the threshold voltage distributions, are further described herein with reference to FIGS. 5A and 5B.

Figure 4A:
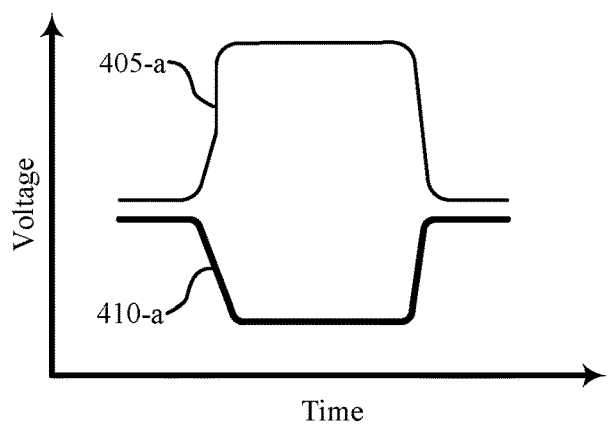
FIGS. 4A, 4B, and 4C illustrate examples of programming pulses that support adjustable programming pulses for an MLC in accordance with examples as disclosed herein.
Figure 4B:
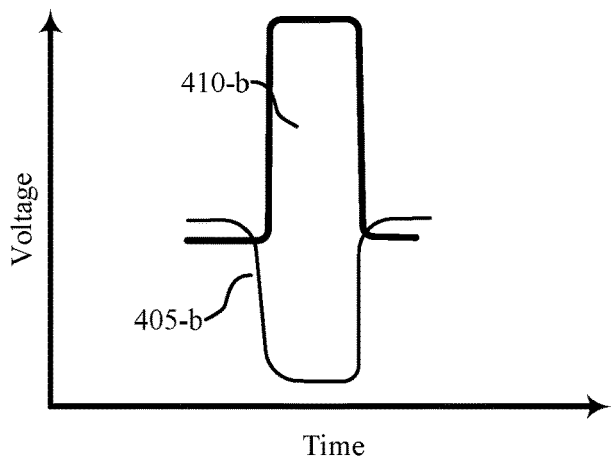
Figure 4C:
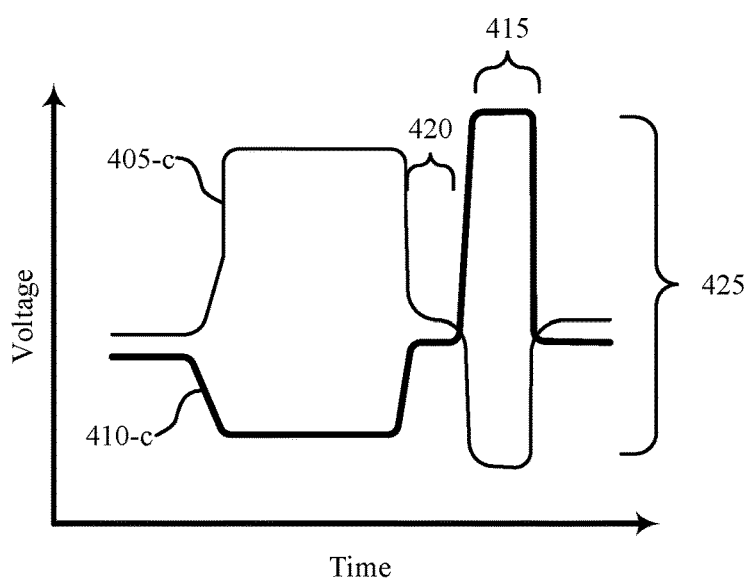

FIGS. 4A, 4B, and 4C illustrate examples of programming pulses 401, 402, and 403 that support adjustable programming pulses for an MLC in accordance with examples as disclosed herein. Programming pulses 401, 402, and 403 may each represent a respective example of a pulse (e.g., or set of pulses) for programming or writing a logic state to a memory cell (e.g., an MLC), as described herein with reference to FIG. 3. For example, each pulse (e.g., or set of pulses) may program a corresponding logic state to the memory cell. While the examples herein describe programming one of three logic states to a memory cell, it is to be understood that such examples may also apply to programming one of four or more logic states to a memory cell without departing from the scope of the present disclosure. For example, similar pulses, or different but similar combinations of pulses, may be used to program a fourth or other logic state to a memory cell.

As described herein with reference to FIG. 3, a memory device (e.g., a controller of a memory device) may apply different pulses (e.g., voltage pulses) to a memory cell (e.g., an MLC) in order to program respective logic states to the memory cell. In an example illustrated by FIG. 4A, a first programming pulse 401 may be used to program or write a first logic state to the memory cell. Applying the first programming pulse 401 may include, in some examples, driving a bit line associated with the memory cell to a first voltage (e.g., as represented by bit line voltage 405-*a*) and concurrently driving a word line associated with the memory cell to a second voltage lower than the first voltage (e.g., as represented by word line voltage 410-*a*). Applying the first programming pulse 401 to the memory cell may result in programming or writing the memory cell to the first logic state (e.g., a SET state).

In an example illustrated by FIG. 4B, a second programming pulse 402 may be used to program or write a second logic state to the memory cell. Applying the second programming pulse 402 may include, in some examples, driving a bit line associated with the memory cell to a third voltage (e.g., as represented by bit line voltage 405-*b*) and concurrently driving a word line associated with the memory cell to a fourth voltage higher than the third voltage (e.g., as represented by word line voltage 410-*b*). Applying the second programming pulse 402 to the memory cell may result in programming or writing the memory cell to the second logic state (e.g., a RESET state).

In an example illustrated by FIG. 4C, a third programming pulse 403 (e.g., a set of programming pulses) may be used to program or write a third logic state to the memory cell. Applying the third programming pulse 403 may include, in some examples, applying the first programming pulse or a programming pulse of the same polarity as the first programming pulse (e.g., a first pulse) followed by the second programming pulse or a programming pulse of the same polarity as the second programming pulse (e.g., a second pulse). For example, bit line voltage 405-*c* may be brought high and word line voltage 410-*c* may be brought low to apply the first pulse, and bit line voltage 405-*c* may be brought low while word line voltage 410-*c* may be brought high to apply the second pulse. Applying the third programming pulse 403 to the memory cell may result in programming or writing the memory cell to the third logic state (e.g., an intermediate state).

The second pulse of the third programming pulse 403 may be associated with one or more characteristics. For example, the second pulse may have a pulse width 415, which may represent a time period over which the second pulse is applied to the memory cell. The second pulse may also have a pulse magnitude 425, which may represent a voltage difference between the word line and the bit line when applying the second pulse. The second pulse may also be associated with a time period 420 between the first pulse and the second pulse. During the time period 420, the memory device may apply the same or a similar voltage to the word line and digit line, such that the voltage difference between the word line and digit line may be less than a voltage for programming the memory cell.

As described herein with reference to FIG. 3, each memory cell may be associated with a threshold voltage for reading the respective memory cell (e.g., where the threshold voltage may be based on an associated logic state programmed or written to the memory cell). The threshold voltages of memory cells associated with a same logic state may form a corresponding threshold voltage distribution for the logic state (e.g., a first, second, or third threshold voltage distribution). For example, with reference to FIGS. 5A and 5B, a first threshold voltage distribution (e.g., associated with the first, SET state) may be represented by a distribution 505-*a* or distribution 505-*b*, a second threshold voltage distribution (e.g., associated with a second, RESET state) may be represented by a distribution 515-*a* or distribution 515-*b*, and a third threshold voltage distribution (e.g., associated with a third, intermediate state) may be represented by a distribution 510.

In some cases, a distribution 510-*a* may begin to drift closer to distribution 505-*a*, for example, as a quantity of programming cycles of the memory cells increases (e.g., based on one or more physical or other conditions of the memory cells). For example, distribution 510-*a* may drift such that it may be represented by a distribution 510-*b*, which may include threshold voltages that are closer to the threshold voltage values included in distribution 505-*a* (e.g., closer than distribution 510-*a*, having respective lower threshold voltage values than those of distribution 510-*a*). In some cases, the drifting of distribution 510-*a* (e.g., to distribution 510-*b* or another distribution) may result in a higher quantity of errors when reading memory cells, among other problems.

For example, reading the first state (e.g., associated with cells represented by distribution 505-*a*) may include determining whether a memory cell may be read using a first voltage 520. Any memory cells that may be read with the first voltage 520 (e.g., memory cells having a threshold voltage less than or equal to the first voltage 520) may be associated with the first state. As such, memory cells having threshold voltages associated with distribution 505-*a* may be determined by the memory device to store the first logic state (e.g., because these cells may have threshold voltages less than or equal to the first voltage 520). In some cases, however, distribution 510-*a* may drift towards distribution 505-*a* such that distribution 510-*a* may include some memory cells having a threshold voltage less than the first voltage 520. Accordingly, some memory cells of distribution 510-*b* (e.g., storing the third state) may be determined by the memory device to store the first state, which may result in read errors for such cells.

The present disclosure provides techniques for reducing or reversing a drift of distribution 510-*b* (e.g., caused by a cycle count). For example, a memory device (e.g., circuitry or a component thereof) may determine a metric of reliability for the third state (e.g., for all of the MLCs, or for the MLCs storing the third state). If the metric of reliability satisfies a condition or a threshold, the memory device may adjust a characteristic of the second pulse (e.g., of the third programming pulse 403) for programming the third state. The adjustment to the characteristic of the second pulse may result in reversing the drift of distribution 510-*b*, and may reduce a quantity of errors associated with the third state. For example, as represented by FIG. 5B, the third distribution of threshold voltages may be represented by distribution 510-*c*, which may represent a distribution that has drifted towards distribution 505-*b* (e.g., the first distribution). Adjusting the characteristic of the second pulse may result in distribution 510-*c* moving back to the right (e.g., experiencing an increase in corresponding threshold voltage levels), such that distribution 510-*c* may move to one of distributions 510-*d*, 510-*e*, or 510-*f*.

Adjusting the characteristic of the second pulse may include adjusting a pulse width 415, a time period 420, or a pulse magnitude 425 associated with the second pulse of the third programming pulse 403. For example, the memory device may reduce a pulse width 415 of the second pulse, which may result in shifting distribution 510-*c* to one of distributions 510-*d*, 510-*e*, or 510-*f*. Additionally or alternatively, the memory device may adjust the time period 420 between the first and second pulses, or adjust (e.g., decrease) a pulse magnitude 425 of the second pulse, which may result in shifting distribution 510-*c* to one of distributions 510-*d*, 510-*e*, or 510-*f*. The adjustment to the second pulse may be made at a level of a die of memory cells, a page of memory cells, a bank of memory cells, or a codeword of memory cells (e.g., a group of memory cells configured to be concurrently accessed, such as by a same access line).

In cases where the adjustment is made at a codeword level, the memory device may adjust the characteristic of the second pulse by programming one or more on-die fuses associated with a codeword, or may adjust the characteristic of the second pulse by programming one or more non-volatile memory cells associated with the codeword. In cases where the adjustment is made at a higher level of the memory device (e.g., a bank or die), the memory device may make the adjustment to the second pulse using a memory controller or other circuitry associated with the higher level of the memory device (e.g., which also may use one or more on-die fuses or one or more non-volatile memory cells).

In some cases, the metric of reliability for determining to adjust the characteristic of the second pulse may be a bit error rate associated with the third state (e.g., as determined when reading cells using the first voltage 520), which may, for example, represent a quantity or percentage of memory cells that store the third state but for which a read operation results in reading the first state (e.g., or another state). In such cases, if the bit error rate is above a threshold error rate, the memory device may determine to adjust the characteristic of the second pulse. For example, the memory device may periodically run a program that triggers a read back pulse to determine the bit error rate, and determine whether the bit error rate is higher than expected (e.g., higher than a threshold calibrated at an initial time).

In some cases, the metric of reliability may be a quantity of memory cells (e.g., MLCs of the memory device) that store the first state (e.g., as determined when reading cells using the first voltage 520 and other voltages associated with other states), where an uneven distribution between the first, second, and third logic states within the memory cells may indicate a drift in a distribution 510 (e.g., distribution 510-*a*). For example, the memory device may use coding to maintain a quantity of cells of the first state in a given set of cells, and a change in that quantity may indicate a voltage threshold shift for the third state. In such cases, if the quantity of memory cells storing the first state satisfies a threshold quantity (e.g., or a threshold percentage), the memory device may determine to adjust the characteristic of the second pulse. For example, the memory device may monitor a quantity of SET state reads (e.g., read values for the first logic state) detected during operation (e.g., of a memory die). If the quantity of SET state reads exceeds the threshold quantity, this may suggest a loss of a read margin due to cycling, and the memory device may adjust the characteristic of the second pulse. When using the bit error rate or the quantity of memory cells storing the first state as the metric of reliability, the memory device may implement the adjustment to the second pulse at a higher level (e.g., a bank or die of cells), such as using a memory controller or other circuitry.

In some cases, the metric of reliability for determining to adjust the characteristic of the second pulse may be a quantity of cycles (e.g., write and/or read cycles) associated with a group of memory cells (e.g., a page, codeword, bank, or die of memory cells). If the quantity of cycles is above a threshold quantity, the memory device may determine to adjust the characteristic of the second pulse. When using the quantity of cycles as the metric of reliability, the memory device may implement the adjustment to the second pulse at a codeword level, or higher.

In some cases, the metric of reliability may be a condition of one or more test memory cells after performing a respective test write operation. For example, the memory device may perform multiple test write operations on the one or more test memory cells, where each test write operation may be associated with a different, respective characteristic (e.g., or set of characteristics) of the second pulse (e.g., each test write operation may use a set of characteristics from a slew of choices for the second pulse). The memory device may determine one or more desired conditions (e.g., a bit error rate, read accuracy) for the test memory cell(s) and identify whether the condition(s) for the memory cell(s) meet the desire condition(s) for each test write operation. The memory device may select a test write operation (e.g., and associated set of characteristics for the second pulse) from one of the test write operations that meets the desired condition(s), or comes within a threshold of the desired condition(s), and may adjust the characteristic of the second pulse to match the set of characteristics from the selected test operation. When using the test operations and associated memory cell condition(s) as the metric of reliability, the memory device may implement the adjustment to the second pulse at a higher level (e.g., a bank or die of cells), such as using a memory controller or other circuitry.

Figure 5A:
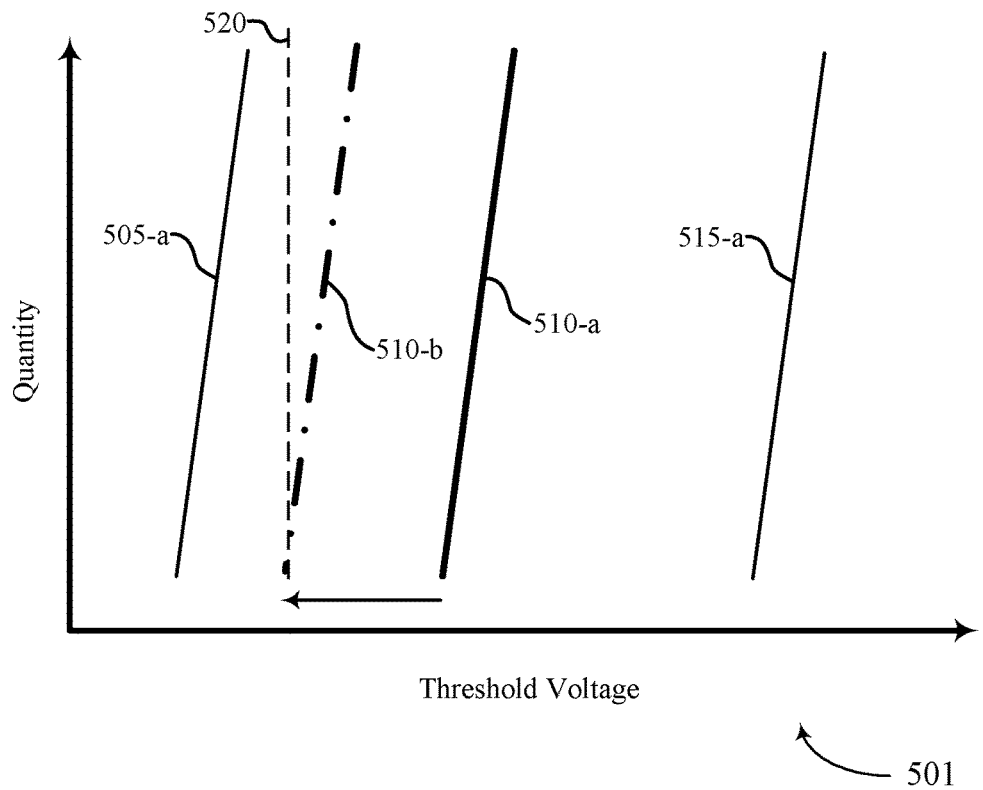
FIGS. 5A and 5B illustrate examples of voltage graphs that support adjustable programming pulses for an MLC in accordance with examples as disclosed herein.
Figure 5B:
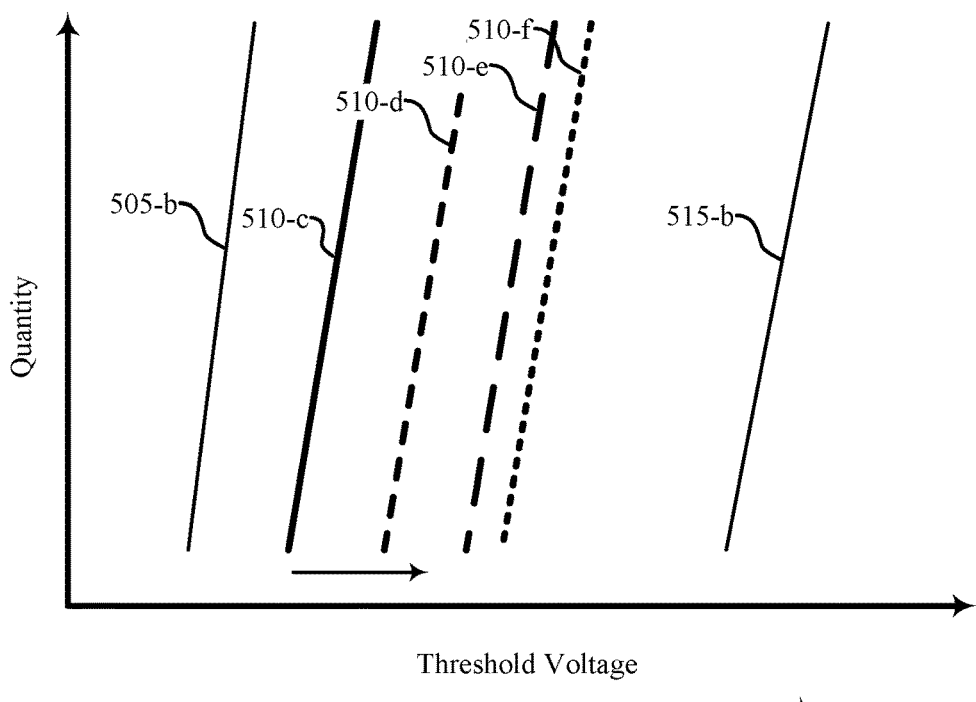

FIGS. 5A and 5B illustrate examples of voltage graphs 501 and 502 that support adjustable programming pulses for an MLC in accordance with examples as disclosed herein. FIG. 5A illustrates example voltage threshold distributions for memory cells programmed to a first logic state, a second logic state, and a third logic state, respectively. As described with reference to FIGS. 4A-4C, cells programmed with the first logic state may correspond to a distribution 505-*a*, cells programmed with the second logic state may correspond to a distribution 515-*a*, and cells programmed with the third logic state may correspond to a distribution 510-*a*, which may drift or change to a distribution 510-*b*.

FIG. 5B also illustrates example voltage threshold distributions for memory cells programmed to the first logic state, the second logic state, and the third logic state, respectively. As further described with reference to FIGS. 4A-4C, cells programmed with the third logic state may correspond to a distribution 510-*c* (e.g., after drifting). Cells programmed with the first logic state may correspond to a distribution 505-*b* and cells programmed with the second logic state may correspond to a distribution 515-*b*. As a result of adjusting a characteristic of a second pulse of a programming pulse for the third logic state, distribution 510-*c* may be modified to one of distributions 510-*d*, 510-*e*, or 510-*f* (e.g., among other examples). For example, distribution 510-*d*, 510-*e*, or 510-*f* may result from reducing a width of the second pulse, where distribution 510-*f* may represent a result of a greatest reduction in width of the second pulse and distribution 510-*d* may represent a result of a smallest reduction in width of the second pulse.

Based on adjusting the characteristic of the second pulse as described herein, distribution 510-*c* may move to be farther from distribution 505-*b*, which may increase a read window (e.g., increased margin) associated with the first logic state, the third logic state, or both. The increased read window may result in a decrease in read errors and an increase in device performance, among other advantages.

Figure 6:
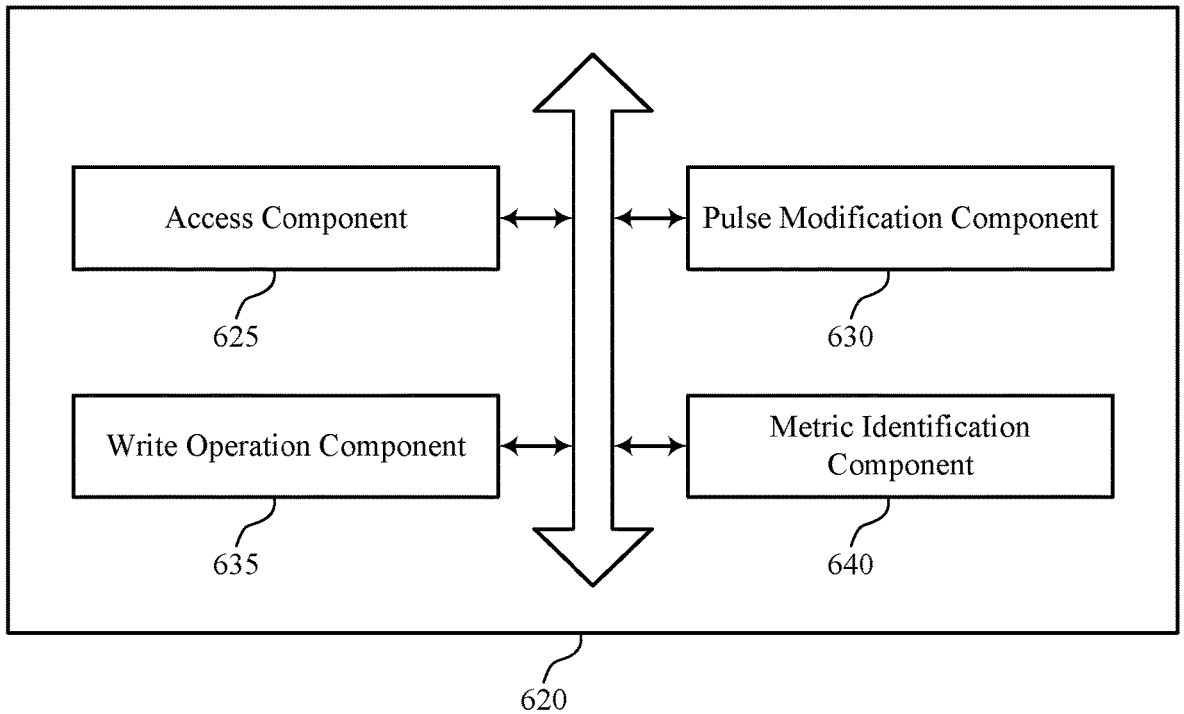
FIG. 6 shows a block diagram of a memory controller that supports adjustable programming pulses for an MLC in accordance with examples as disclosed herein.

FIG. 6 shows a block diagram 600 of a memory controller 620 that supports adjustable programming pulses for an MLC in accordance with examples as disclosed herein.

The memory controller 620 may be an example of aspects of a memory controller as described with reference to FIGS. 1 through 5. The memory controller 620, or various components thereof, may be an example of means for performing various aspects of adjustable programming pulses for an MLC as described herein. For example, the memory controller 620 may include an access component 625, a pulse modification component 630, a write operation component 635, a metric identification component 640, or any combination thereof. Each of these components may communicate, directly or indirectly, with one another (e.g., via one or more buses).

The access component 625 may be configured as or otherwise support a means for receiving an access command at a memory device including a set of multiple memory cells, each memory cell of the set of multiple memory cells configured to store one state from a set of states including a first state, a second state, and a third state, where writing a memory cell to the third state includes applying a first pulse of a first polarity and a second pulse of a second polarity. The pulse modification component 630 may be configured as or otherwise support a means for modifying a characteristic of the second pulse based on a metric of reliability of the third state associated with a set of memory cells of the set of multiple memory cells. The write operation component 635 may be configured as or otherwise support a means for performing a write operation on a first memory cell of the set of multiple memory cells based on the access command, where performing the write operation includes applying the first pulse and the second pulse with the modified characteristic.

In some examples, the pulse modification component 630 may be configured as or otherwise support a means for performing a set of multiple test write operations on a test memory cell of the set of multiple memory cells, each test write operation of the plurality associated with a respective characteristic of the second pulse. In some examples, the pulse modification component 630 may be configured as or otherwise support a means for identifying, for each test write operation of the plurality, a respective condition of the test memory cell based on performing the set of multiple test write operations. In some examples, the pulse modification component 630 may be configured as or otherwise support a means for determining the modified characteristic of the second pulse based on the respective conditions of the test memory cell and the respective characteristics of the second pulse for the set of multiple test write operations, where modifying the characteristic is based on determining the modified characteristic.

In some examples, the metric identification component 640 may be configured as or otherwise support a means for identifying a quantity of memory cells storing the first state within at least a subset of the set of memory cells, the quantity of memory cells including the metric of reliability. In some examples, the metric identification component 640 may be configured as or otherwise support a means for determining that the quantity of memory cells satisfies a threshold, where modifying the characteristic of the second pulse is based on the determining.

In some examples, the metric identification component 640 may be configured as or otherwise support a means for identifying a bit error rate for at least a subset of the set of memory cells, the bit error rate including the metric of reliability and associated with a read operation for the set of memory cells. In some examples, the metric identification component 640 may be configured as or otherwise support a means for determining that the bit error rate satisfies a threshold, where modifying the characteristic of the second pulse is based on the determining.

In some examples, the metric identification component 640 may be configured as or otherwise support a means for identifying a quantity of write cycles associated with the set of memory cells, the quantity of write cycles including the metric of reliability. In some examples, the metric identification component 640 may be configured as or otherwise support a means for determining that the quantity of write cycles satisfies a threshold, where modifying the characteristic of the second pulse is based on the determining.

In some examples, to support modifying the characteristic, the pulse modification component 630 may be configured as or otherwise support a means for programming one or more fuses of the memory device to configure the modified characteristic of the second pulse. In some examples, to support modifying the characteristic, the pulse modification component 630 may be configured as or otherwise support a means for programming one or more non-volatile memory cells of the memory device to configure the modified characteristic of the second pulse.

In some examples, the set of memory cells includes a group of memory cells configured to be concurrently accessed. In some examples, the set of memory cells includes a page, a bank, or a die of memory cells. In some examples, the characteristic of the second pulse includes a time between the first pulse and the second pulse, a magnitude of the second pulse, a width of the second pulse, or any combination thereof. In some examples, to support modifying the characteristic, the pulse modification component 630 may be configured as or otherwise support a means for reducing a width of the second pulse for writing the third state.

In some examples, to support applying the first pulse of the first polarity, the write operation component 635 may be configured as or otherwise support a means for driving a bit line associated with the memory cell to a first voltage. In some examples, to support applying the first pulse of the first polarity, the write operation component 635 may be configured as or otherwise support a means for driving a word line associated with the memory cell to a second voltage, the second voltage lower than the first voltage.

In some examples, to support applying the second pulse of the second polarity, the write operation component 635 may be configured as or otherwise support a means for driving the bit line to a third voltage. In some examples, to support applying the second pulse of the second polarity, the write operation component 635 may be configured as or otherwise support a means for driving the word line to a fourth voltage, the third voltage lower than the fourth voltage.

Figure 7:
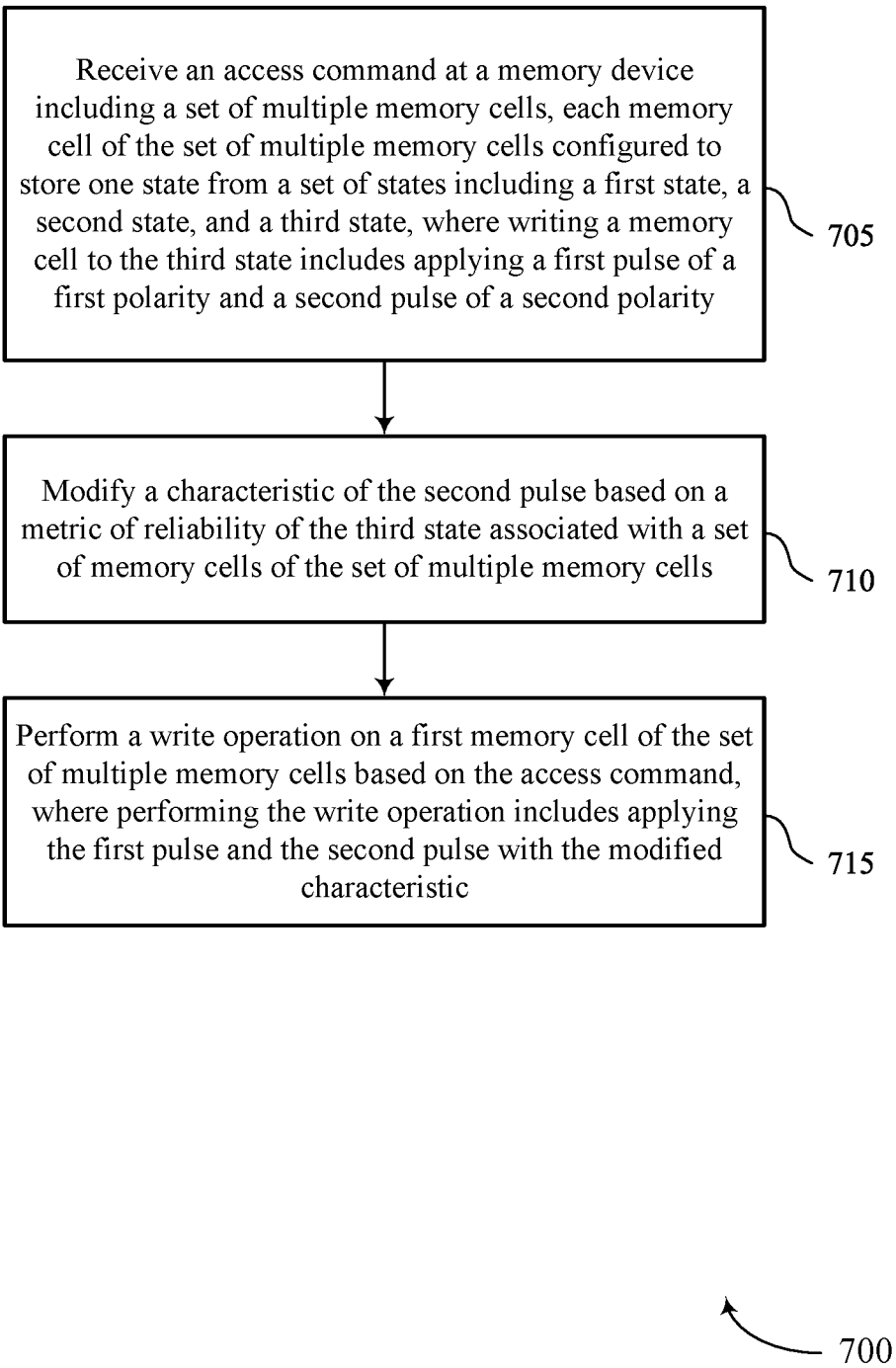
FIG. 7 shows a flowchart illustrating a method or methods that support adjustable programming pulses for an MLC in accordance with examples as disclosed herein.

FIG. 7 shows a flowchart illustrating a method 700 that supports adjustable programming pulses for an MLC in accordance with examples as disclosed herein. The operations of method 700 may be implemented by a memory controller or its components as described herein. For example, the operations of method 700 may be performed by a memory controller as described with reference to FIGS. 1 through 6. In some examples, a memory controller may execute a set of instructions to control the functional elements of the device to perform the described functions. Additionally or alternatively, the memory controller may perform aspects of the described functions using special-purpose hardware.

At 705, the method may include receiving an access command at a memory device including a set of multiple memory cells, each memory cell of the set of multiple memory cells configured to store one state from a set of states including a first state, a second state, and a third state, where writing a memory cell to the third state includes applying a first pulse of a first polarity and a second pulse of a second polarity. The operations of 705 may be performed in accordance with examples as disclosed herein. In some examples, aspects of the operations of 705 may be performed by an access component 625 as described with reference to FIG. 6.

At 710, the method may include modifying a characteristic of the second pulse based on a metric of reliability of the third state associated with a set of memory cells of the set of multiple memory cells. The operations of 710 may be performed in accordance with examples as disclosed herein. In some examples, aspects of the operations of 710 may be performed by a pulse modification component 630 as described with reference to FIG. 6.

At 715, the method may include performing a write operation on a first memory cell of the set of multiple memory cells based on the access command, where performing the write operation includes applying the first pulse and the second pulse with the modified characteristic. The operations of 715 may be performed in accordance with examples as disclosed herein. In some examples, aspects of the operations of 715 may be performed by a write operation component 635 as described with reference to FIG. 6.

In some examples, an apparatus as described herein may perform a method or methods, such as the method 700. The apparatus may include, features, circuitry, logic, means, or instructions (e.g., a non-transitory computer-readable medium storing instructions executable by a processor) for receiving an access command at a memory device including a set of multiple memory cells, each memory cell of the set of multiple memory cells configured to store one state from a set of states including a first state, a second state, and a third state, where writing a memory cell to the third state includes applying a first pulse of a first polarity and a second pulse of a second polarity, modifying a characteristic of the second pulse based on a metric of reliability of the third state associated with a set of memory cells of the set of multiple memory cells, and performing a write operation on a first memory cell of the set of multiple memory cells based on the access command, where performing the write operation includes applying the first pulse and the second pulse with the modified characteristic.

Some examples of the method 700 and the apparatus described herein may further include operations, features, circuitry, logic, means, or instructions for performing a set of multiple test write operations on a test memory cell of the set of multiple memory cells, each test write operation of the plurality associated with a respective characteristic of the second pulse, identifying, for each test write operation of the plurality, a respective condition of the test memory cell based on performing the set of multiple test write operations, and determining the modified characteristic of the second pulse based on the respective conditions of the test memory cell and the respective characteristics of the second pulse for the set of multiple test write operations, where modifying the characteristic may be based on determining the modified characteristic.

Some examples of the method 700 and the apparatus described herein may further include operations, features, circuitry, logic, means, or instructions for identifying a quantity of memory cells storing the first state within at least a subset of the set of memory cells, the quantity of memory cells including the metric of reliability and determining that the quantity of memory cells satisfies a threshold, where modifying the characteristic of the second pulse may be based on the determining.

Some examples of the method 700 and the apparatus described herein may further include operations, features, circuitry, logic, means, or instructions for identifying a bit error rate for at least a subset of the set of memory cells, the bit error rate including the metric of reliability and associated with a read operation for the set of memory cells and determining that the bit error rate satisfies a threshold, where modifying the characteristic of the second pulse may be based on the determining.

Some examples of the method 700 and the apparatus described herein may further include operations, features, circuitry, logic, means, or instructions for identifying a quantity of write cycles associated with the set of memory cells, the quantity of write cycles including the metric of reliability and determining that the quantity of write cycles satisfies a threshold, where modifying the characteristic of the second pulse may be based on the determining.

In some examples of the method 700 and the apparatus described herein, modifying the characteristic may include operations, features, circuitry, logic, means, or instructions for programming one or more fuses of the memory device to configure the modified characteristic of the second pulse.

In some examples of the method 700 and the apparatus described herein, modifying the characteristic may include operations, features, circuitry, logic, means, or instructions for programming one or more non-volatile memory cells of the memory device to configure the modified characteristic of the second pulse.

In some examples of the method 700 and the apparatus described herein, the set of memory cells includes a group of memory cells configured to be concurrently accessed. In some examples of the method 700 and the apparatus described herein, the set of memory cells includes a page, a bank, or a die of memory cells. In some examples of the method 700 and the apparatus described herein, the characteristic of the second pulse includes a time between the first pulse and the second pulse, a magnitude of the second pulse, a width of the second pulse, or any combination thereof.

In some examples of the method 700 and the apparatus described herein, modifying the characteristic may include operations, features, circuitry, logic, means, or instructions for reducing a width of the second pulse for writing the third state.

In some examples of the method 700 and the apparatus described herein, applying the first pulse of the first polarity may include operations, features, circuitry, logic, means, or instructions for driving a bit line associated with the memory cell to a first voltage and driving a word line associated with the memory cell to a second voltage, the second voltage lower than the first voltage.

In some examples of the method 700 and the apparatus described herein, applying the second pulse of the second polarity may include operations, features, circuitry, logic, means, or instructions for driving the bit line to a third voltage and driving the word line to a fourth voltage, the third voltage lower than the fourth voltage.

It should be noted that the methods described herein describe possible implementations, and that the operations and the steps may be rearranged or otherwise modified and that other implementations are possible. Furthermore, portions from two or more of the methods may be combined.

Another apparatus is described. The apparatus may include a set of multiple memory cells each operable to be written to a logic state from a set of logic states including a first logic state, a second logic state, and a third logic state, where writing a memory cell to the third logic state includes applying a first voltage pulse of a first polarity and a second voltage pulse of a second polarity, circuitry operable to modify a characteristic of the second voltage pulse based on a metric of reliability of the third logic state associated with a set of memory cells of the set of multiple memory cells, a word line coupled with a first memory cell of the set of multiple memory cells, a bit line coupled with the first memory cell, and a driver, where the driver is operable to drive the word line and the bit line to apply, to the first memory cell, the first voltage pulse and apply, to the first memory cell, the second voltage pulse with the modified characteristic.

In some examples, the apparatus may include one or more fuses operable to be programmed to modify the characteristic of the second voltage pulse. In some examples, the apparatus may include one or more non-volatile memory cells operable to be programmed to modify the characteristic of the second voltage pulse.

In some examples, the apparatus may include perform a set of multiple test write operations on a test memory cell of the set of multiple memory cells, each test write operation of the plurality associated with a respective characteristic of the second voltage pulse, identify, for each test write operation of the plurality, a respective condition of the test memory cell based on performing the set of multiple test write operations, and determine the modified characteristic of the second voltage pulse based on the respective conditions of the test memory cell and the respective characteristics of the second voltage pulse for the set of multiple test write operations, where modifying the characteristic may be based on determining the modified characteristic.

In some examples, the apparatus may include identify a quantity of memory cells storing the first logic state within at least a subset of the set of memory cells, the quantity of memory cells including the metric of reliability and determine that the quantity of memory cells satisfies a threshold, where modifying the characteristic of the second voltage pulse may be based on the determining.

In some examples, the apparatus may include identify a bit error rate for at least a subset of the set of memory cells, the bit error rate including the metric of reliability and associated with a read operation for the set of memory cells and determine that the bit error rate satisfies a threshold, where modifying the characteristic of the second voltage pulse may be based on the determining.

In some examples, the apparatus may include identify a quantity of write cycles associated with the set of memory cells, the quantity of write cycles including the metric of reliability and determining that the quantity of write cycles satisfies a threshold, where modifying the characteristic of the second voltage pulse may be based on the determining.

In some examples of the apparatus, the set of memory cells includes a page of memory cells, a bank of memory cells, a die of memory cells, or a group of memory cells configured to be concurrently accessed. In some examples of the apparatus, the characteristic of the second voltage pulse includes a time between the first voltage pulse and the second voltage pulse, a magnitude of the second voltage pulse, a width of the second voltage pulse, or any combination thereof.

Another apparatus is described. The apparatus may include a set of multiple memory cells each operable to be written to a logic state from a set of logic states including a first logic state, a second logic state, and a third logic state, where writing a memory cell to the third logic state includes applying a first voltage pulse of a first polarity and a second voltage pulse of a second polarity, a word line coupled with a first memory cell of the set of multiple memory cells, a bit line coupled with the first memory cell, and a controller coupled with the word line and the digit line, the controller operable to set a characteristic of the second voltage pulse based on a metric of reliability of the third logic state associated with a set of memory cells of the set of multiple memory cells, apply, via the word line and the digit line, the first voltage pulse to the first memory cell, and apply, via the word line and the digit line, the second voltage pulse with the characteristic to the first memory cell.

In some examples, the apparatus may include perform a set of multiple test write operations on a test memory cell of the set of multiple memory cells, each test write operation of the plurality associated with a respective characteristic of the second voltage pulse, identify, for each test write operation of the plurality, a respective condition of the test memory cell based on performing the set of multiple test write operations, and determine the characteristic of the second voltage pulse based on the respective conditions of the test memory cell and the respective characteristics of the second voltage pulse for the set of multiple test write operations, where setting the characteristic may be based on determining the characteristic.

In some examples, the apparatus may include identify a quantity of memory cells storing the first logic state within at least a subset of the set of memory cells, identify a bit error rate for at least the subset of the set of memory cells, the bit error rate associated with a read operation for each memory cell of the set of memory cells, identify a quantity of write cycles associated with at least the subset of the set of memory cells, and determine that the quantity of memory cells satisfies a first threshold, that the bit error rate satisfies a second threshold, or that the quantity of write cycles satisfies a third threshold, or any combination thereof, where modifying the characteristic of the second voltage pulse may be based on the determining.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" or "level" used herein refers to a stratum or sheet of a geometrical structure (e.g., relative to a substrate). Each layer or level may have three dimensions (e.g., height, width, and depth) and may cover at least a portion of a surface. For example, a layer or level may be a three-dimensional structure where two dimensions are greater than a third, e.g., a thin-film. Layers or levels may include different elements, components, and/or materials. In some examples, one layer or level may be composed of two or more sublayers or sublevels.

As used herein, the term "substantially" means that the modified characteristic (e.g., a verb or adjective modified by the term substantially) need not be absolute but is close enough to achieve the advantages of the characteristic. Similarly, the term "substantial" as used herein means that the modified characteristic (e.g., a noun modified by the term substantial) need not be absolute but is close enough to achieve the advantages of the characteristic.

As used herein, the term "electrode" may refer to an electrical conductor, and in some examples, may be employed as an electrical contact to a memory cell or other component of a memory array. An electrode may include a trace, wire, conductive line, conductive layer, or the like that provides a conductive path between elements or components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of these are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
   receiving an access command at a memory device comprising a plurality of memory cells, each memory cell of the plurality of memory cells configured to store one state from a set of states comprising a first state, a second state, and a third state, wherein writing a memory cell to the third state comprises applying a first pulse of a first polarity and a second pulse of a second polarity;
   modifying a characteristic of the second pulse based at least in part on a metric of reliability of the third state associated with a set of memory cells of the plurality of memory cells; and
   performing a write operation on a first memory cell of the plurality of memory cells based at least in part on the access command, wherein performing the write operation comprises applying the first pulse and the second pulse with the modified characteristic.

2. The method of claim 1, further comprising:
   performing a plurality of test write operations on a test memory cell of the plurality of memory cells, each test write operation of the plurality associated with a respective characteristic of the second pulse;
   identifying, for each test write operation of the plurality, a respective condition of the test memory cell based at least in part on performing the plurality of test write operations; and
   determining the modified characteristic of the second pulse based at least in part on the respective conditions of the test memory cell and the respective characteristics of the second pulse for the plurality of test write operations, wherein modifying the characteristic is based at least in part on determining the modified characteristic.

3. The method of claim 1, further comprising:
   identifying a quantity of memory cells storing the first state within at least a subset of the set of memory cells, the quantity of memory cells comprising the metric of reliability; and
   determining that the quantity of memory cells satisfies a threshold, wherein modifying the characteristic of the second pulse is based at least in part on the determining.

4. The method of claim 1, further comprising:
   identifying a bit error rate for at least a subset of the set of memory cells, the bit error rate comprising the metric of reliability and associated with a read operation for the set of memory cells; and
   determining that the bit error rate satisfies a threshold, wherein modifying the characteristic of the second pulse is based at least in part on the determining.

5. The method of claim 1, further comprising:
   identifying a quantity of write cycles associated with the set of memory cells, the quantity of write cycles comprising the metric of reliability; and
   determining that the quantity of write cycles satisfies a threshold, wherein modifying the characteristic of the second pulse is based at least in part on the determining.

6. The method of claim 5, wherein modifying the characteristic comprises:
   programming one or more fuses of the memory device to configure the modified characteristic of the second pulse.

7. The method of claim 5, wherein modifying the characteristic comprises:
   programming one or more non-volatile memory cells of the memory device to configure the modified characteristic of the second pulse.

8. The method of claim 5, wherein the set of memory cells comprises a group of memory cells configured to be concurrently accessed.

9. The method of claim 1, wherein the set of memory cells comprises a page, a bank, or a die of memory cells.

10. The method of claim 1, wherein the characteristic of the second pulse comprises a time between the first pulse and the second pulse, a magnitude of the second pulse, a width of the second pulse, or any combination thereof.

11. The method of claim 1, wherein modifying the characteristic comprises:
    reducing a width of the second pulse for writing the third state.

12. The method of claim 1, wherein applying the first pulse of the first polarity comprises:
    driving a bit line associated with the memory cell to a first voltage; and
    driving a word line associated with the memory cell to a second voltage, the second voltage lower than the first voltage.

13. The method of claim 12, wherein applying the second pulse of the second polarity comprises:
    driving the bit line to a third voltage; and
    driving the word line to a fourth voltage, the third voltage lower than the fourth voltage.

14. An apparatus, comprising:
    a plurality of memory cells each operable to be written to a logic state from a set of logic states comprising a first logic state, a second logic state, and a third logic state, wherein writing a memory cell to the third logic state comprises applying a first voltage pulse of a first polarity and a second voltage pulse of a second polarity;
    circuitry operable to modify a characteristic of the second voltage pulse based at least in part on a metric of reliability of the third logic state associated with a set of memory cells of the plurality of memory cells;
    a word line coupled with a first memory cell of the plurality of memory cells;
    a bit line coupled with the first memory cell; and
    a driver, wherein the driver is operable to drive the word line and the bit line to:
    apply, to the first memory cell, the first voltage pulse; and apply, to the first memory cell, the second voltage pulse with the modified characteristic.

15. The apparatus of claim 14, further comprising:
one or more fuses operable to be programmed to modify the characteristic of the second voltage pulse.

16. The apparatus of claim 14, further comprising:
one or more non-volatile memory cells operable to be programmed to modify the characteristic of the second voltage pulse.

17. The apparatus of claim 14, wherein the circuitry is further operable to:
perform a plurality of test write operations on a test memory cell of the plurality of memory cells, each test write operation of the plurality associated with a respective characteristic of the second voltage pulse;
identify, for each test write operation of the plurality, a respective condition of the test memory cell based at least in part on performing the plurality of test write operations; and
determine the modified characteristic of the second voltage pulse based at least in part on the respective conditions of the test memory cell and the respective characteristics of the second voltage pulse for the plurality of test write operations, wherein modifying the characteristic is based at least in part on determining the modified characteristic.

18. The apparatus of claim 14, wherein the circuitry is further operable to:
identify a quantity of memory cells storing the first logic state within at least a subset of the set of memory cells, the quantity of memory cells comprising the metric of reliability; and
determine that the quantity of memory cells satisfies a threshold, wherein modifying the characteristic of the second voltage pulse is based at least in part on the determining.

19. The apparatus of claim 14, wherein the circuitry is further operable to:
identify a bit error rate for at least a subset of the set of memory cells, the bit error rate comprising the metric of reliability and associated with a read operation for the set of memory cells; and
determine that the bit error rate satisfies a threshold, wherein modifying the characteristic of the second voltage pulse is based at least in part on the determining.

20. The apparatus of claim 14, wherein the circuitry is further operable to:
identify a quantity of write cycles associated with the set of memory cells, the quantity of write cycles comprising the metric of reliability; and
determining that the quantity of write cycles satisfies a threshold, wherein modifying the characteristic of the second voltage pulse is based at least in part on the determining.

21. The apparatus of claim 14, wherein the set of memory cells comprises a page of memory cells, a bank of memory cells, a die of memory cells, or a group of memory cells configured to be concurrently accessed.

22. The apparatus of claim 14, wherein the characteristic of the second voltage pulse comprises a time between the first voltage pulse and the second voltage pulse, a magnitude of the second voltage pulse, a width of the second voltage pulse, or any combination thereof.

23. An apparatus, comprising:
a plurality of memory cells each operable to be written to a logic state from a set of logic states comprising a first logic state, a second logic state, and a third logic state, wherein writing a memory cell to the third logic state comprises applying a first voltage pulse of a first polarity and a second voltage pulse of a second polarity;
a word line coupled with a first memory cell of the plurality of memory cells;
a bit line coupled with the first memory cell; and
a controller coupled with the word line and the bit line, the controller operable to:
set a characteristic of the second voltage pulse based at least in part on a metric of reliability of the third logic state associated with a set of memory cells of the plurality of memory cells;
apply, via the word line and the bit line, the first voltage pulse to the first memory cell; and
apply, via the word line and the bit line, the second voltage pulse with the characteristic to the first memory cell.

24. The apparatus of claim 23, wherein the controller is further operable to:
perform a plurality of test write operations on a test memory cell of the plurality of memory cells, each test write operation of the plurality associated with a respective characteristic of the second voltage pulse;
identify, for each test write operation of the plurality, a respective condition of the test memory cell based at least in part on performing the plurality of test write operations; and
determine the characteristic of the second voltage pulse based at least in part on the respective conditions of the test memory cell and the respective characteristics of the second voltage pulse for the plurality of test write operations, wherein setting the characteristic is based at least in part on determining the characteristic.

25. The apparatus of claim 23, wherein the controller is further operable to:
identify a quantity of memory cells storing the first logic state within at least a subset of the set of memory cells;
identify a bit error rate for at least the subset of the set of memory cells, the bit error rate associated with a read operation for each memory cell of the set of memory cells;
identify a quantity of write cycles associated with at least the subset of the set of memory cells; and
determine that the quantity of memory cells satisfies a first threshold, that the bit error rate satisfies a second threshold, or that the quantity of write cycles satisfies a third threshold, or any combination thereof, wherein modifying the characteristic of the second voltage pulse is based at least in part on the determining.

* * * * *